US008698472B2

(12) United States Patent
Yang et al.

(10) Patent No.: US 8,698,472 B2
(45) Date of Patent: Apr. 15, 2014

(54) ADJUSTABLE DRIVER VOLTAGE SOURCE FOR A SWITCHING POWER SUPPLY AND METHOD FOR ADJUSTING DRIVER VOLTAGE IN A SWITCHING POWER SUPPLY

(75) Inventors: Tsung-Hsi Yang, Xinbei (TW); Shao-Hung Lu, Taoyuan County (TW); Isaac Y. Chen, Hsinchu County (TW); Wei-Haur Chan, Hsinchu County (TW)

(73) Assignee: Richtek Technology Corp., Hsinchu (TW)

( * ) Notice: Subject to any disclaimer, the term of this patent is extended or adjusted under 35 U.S.C. 154(b) by 229 days.

(21) Appl. No.: 12/984,066

(22) Filed: Jan. 4, 2011

(65) Prior Publication Data

US 2011/0169463 A1  Jul. 14, 2011

(30) Foreign Application Priority Data

Jan. 14, 2010  (TW) .............................. 99100887 A

(51) Int. Cl.
*G05F 1/00* (2006.01)
*G05F 1/565* (2006.01)
*G05F 1/618* (2006.01)
*G05F 3/16* (2006.01)

(52) U.S. Cl.
USPC ........... 323/285; 323/283; 323/275; 323/226; 323/224

(58) Field of Classification Search
USPC .................. 323/271–285, 222, 226, 223, 224
See application file for complete search history.

(56) References Cited

U.S. PATENT DOCUMENTS

| | | | |
|---|---|---|---|
| 7,218,168 B1 * | 5/2007 | Rahman | 327/540 |
| 7,345,463 B2 * | 3/2008 | Isham | 323/285 |
| 7,474,086 B2 * | 1/2009 | Chen et al. | 323/288 |
| 7,847,531 B2 * | 12/2010 | Qiu et al. | 323/282 |
| 2006/0038547 A1 * | 2/2006 | Ahmad | 323/284 |

* cited by examiner

*Primary Examiner* — Bao Q Vu
*Assistant Examiner* — Zekre Tsehaye
(74) *Attorney, Agent, or Firm* — Muncy, Geissler, Olds & Lowe, P.C.

(57) ABSTRACT

An adjustable driver voltage source for a switching power supply uses a linear regulator to provide a driver voltage, and a modulator to adjust the driver voltage according to the loading change of the switching power supply. The modulator may lower the driver voltage at light load to reduce the switching loss and thereby increase the power efficiency of the switching power supply.

6 Claims, 9 Drawing Sheets

US 8,698,472 B2

ADJUSTABLE DRIVER VOLTAGE SOURCE FOR A SWITCHING POWER SUPPLY AND METHOD FOR ADJUSTING DRIVER VOLTAGE IN A SWITCHING POWER SUPPLY

FIELD OF THE INVENTION

The present invention is related generally to a switching power supply and, more particularly, to an adjustable driver voltage source for a switching power supply and a method for adjusting driver voltage in a switching power supply.

BACKGROUND OF THE INVENTION

In an asynchronous switching power supply, typically, as shown in FIG. 1, a power switch M1 and a diode D1 are serially connected between a voltage input terminal Vin and a ground terminal GND, an inductor L is connected between a switch node 14 and a voltage output terminal Vo, a capacitor Co is connected between the voltage output terminal Vo and the ground terminal GND, a driver 12 generates a control signal S1 according to a pulse width modulation (PWM) signal provided by a PWM controller 10 to switch the power switch M1 to convert an input voltage Vin to an output voltage Vo, and the supplied driver voltage Vcc of the driver 12 determines the voltage level of the control signal S1. In light loading operation, the switching power supply will have low power efficiency due to switching loss. If the switching frequency of the power switch M1 is f, then the switching loss will be $$P_{Loss} = f \times Cin \times Vcc^2. \quad [\text{Eq-1}]$$

where Cin is the equivalent capacitance at the gate of the power switch M1. According to the equation Eq-1, lower driver voltage Vcc results in less switching loss $P_{Loss}$. FIG. 2 is a diagram showing the power efficiency to loading of the circuit of FIG. 1 under different driver voltages Vcc, in which curve 16 depicts the power efficiency under the driver voltage Vcc of 6 V, and curve 18 depicts the power efficiency under the driver voltage Vcc of 12 V. FIG. 2 clearly shows that at light loading, the switching power supply under the driver voltage Vcc of 6 V will have higher efficiency than under the driver voltage Vcc of 12 V.

In order to reduce the switching loss of a switching power supply at light loading, there have been proposed many circuits for providing adjustable driver voltage Vcc of a driver. For example, FIG. 3 is a block diagram of the Intersil's driver chip 20 with product no. ISL6622, which uses a linear regulator 22 to provide a driver voltage LVCC to a low-side driver 26, and the linear regulator 22 changes the driver voltage LVCC according to an external signal GD_SEL and thus may provide lower driver voltage LVCC at light loading to improve the power efficiency. However, the driver chip 20 requires two power supplies LVCC and UVCC to provide the driver voltages for a high-side driver 24 and the low-side driver 26, respectively, so that the circuit is complicated. U.S. Pat. No. 7,345,463 proposes a method for providing an adjustable driver voltage for a single chip, which changes the driver voltage supplied to a driver by detecting the load current of a power supply, and may even optimize the driver voltage by use of the load current, the input voltage, the output voltage and the characteristic parameters of the power switch. However, this method requires more complicated circuit.

SUMMARY OF THE INVENTION

An object of the present invention is to provide an adjustable driver voltage source for a switching power supply.

Another object of the present invention is to provide a method for adjusting driver voltage in a switching power supply.

According to the present invention, an adjustable driver voltage source for a switching power supply uses a linear regulator to provide a driver voltage to a driver that determines the voltage level of a control signal for switching a power switch of the switching power supply, and a modulator responsive to the loading change of the switching power supply to control the linear regulator to adjust the driver voltage.

According to the present invention, a method for adjusting a driver voltage in a switching power supply provides a driver voltage to a driver that determines the voltage level of a control signal for switching a power switch of the switching power supply, detects the driver voltage to generate a feedback signal to adjust the driver voltage, and adjusts the feedback signal in response to the loading change of the switching power supply to adjust the driver voltage.

According to the present invention, the driver voltage provided to a driver is adjusted according to the loading change of a switching power supply, so that the driver voltage can be lowered at light loading to improve the power efficiency of the switching power supply.

BRIEF DESCRIPTION OF THE DRAWINGS

These and other objects, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 4:
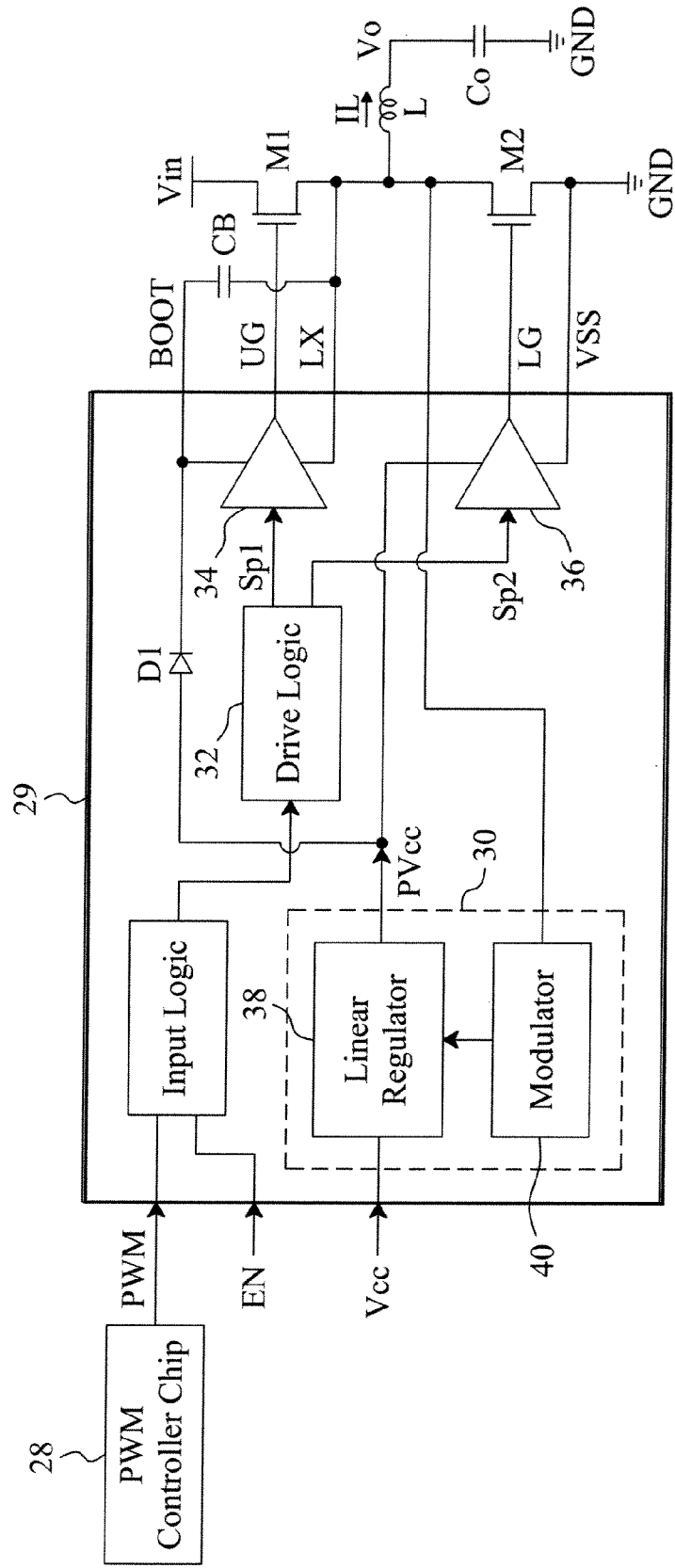
FIG. 4 is a block diagram of a first embodiment according to the present invention.

FIG. 4 is a block diagram of a first embodiment according to the present invention. A switching power supply includes several chips, of which a PWM controller chip 28 provides a pulse width modulation signal PWM to a driver chip 29 to control the driver chip 29 to switch power switches M1 and M2 serially connected between a voltage input terminal Vin and a ground terminal GND to convert an input voltage Vin to an output voltage Vo. In the driver chip 29, a drive logic 32 generates signals Sp1 and Sp2 according to the pulse width modulation signal PWM provided by the PWM controller chip 28, a high-side driver 34 and a low-side driver 36 generate control signals UG and LG according to the signals Sp1 and Sp2 to switch the power switches M1 and M2, respectively, and an adjustable driver voltage source 30 detects the load current IL of the switching power supply to acquire loading information and adjusts a driver voltage PVcc supplied to the drivers 34 and 36 accordingly to adjust the voltage levels of the control signals UG and LG. The adjustable driver voltage source 30 includes a linear regulator 38 and a modulator 40. The linear regulator 38 converts a supplied voltage Vcc to the driver voltage PVcc, and the modulator 40 detects the load current IL to control the linear regulator 38 to adjust the driver voltage PVcc. In this embodiment, the driver chip 29 does not need an external signal for adjusting the driver voltage PVcc.

Figure 5:
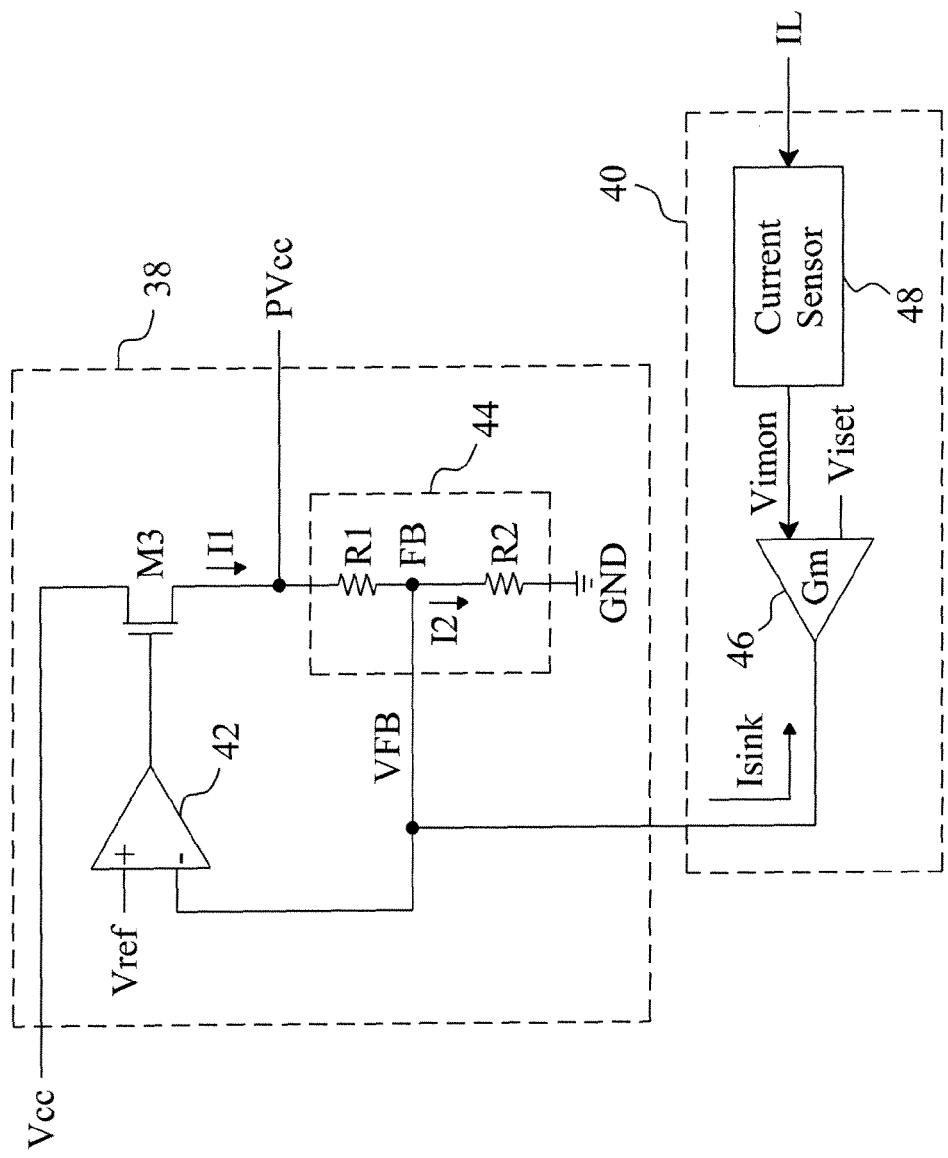
FIG. 5 is a circuit diagram of a first embodiment for the linear regulator and the modulator shown in FIG. 4.

FIG. 5 is a circuit diagram of a first embodiment for the linear regulator 38 and the modulator 40 shown in FIG. 4. The linear regulator 38 includes a MOSFET M3 connected between the voltage input terminal Vcc and the voltage output terminal PVcc of the linear regulator 38, an operational amplifier 42 for comparing a feedback signal VFB with a reference voltage Vref to control the current I1 of the NOSFET M3 to determine the driver voltage PVcc, and a feedback loop 44 for detecting the driver voltage PVcc to generate the feedback signal VFB. The feedback loop 44 includes resistors R1 and R2 serially connected between the voltage output terminal PVcc and a ground terminal GND to establish a voltage divider to divide the driver voltage PVcc to generate the feedback signal VFB at a feedback terminal FB. The modulator 40 includes a current sensor 48 for sensing the load current IL to generate a current sense signal Vimon, and a transconductance amplifier 46 for sinking a current Isink from the feedback terminal FB according to the difference value between the current sense signal Vimon and a setting value Viset so as to change the feedback signal VFB. When the switching power supply is at light loading, the current sense signal Vimon will be lower than the setting value Viset, and thus the transconductance amplifier 46 does not sink any current Isink from the feedback terminal FB, thereby regulating the driver voltage PVcc at a lower level, for example 3V. When the switching power supply turns to heavy loading, the current sense signal Vimon becomes higher than the setting value Viset and causes the transconductance amplifier 46 to sink a current Isink from the feedback terminal FB, thereby lowering the feedback signal VFB. As a result, the operational amplifier 42 increases the current I1 of the MOSFET M3, and the driver voltage PVcc is thus increased to a higher level, for example 5 V.

Figure 6:
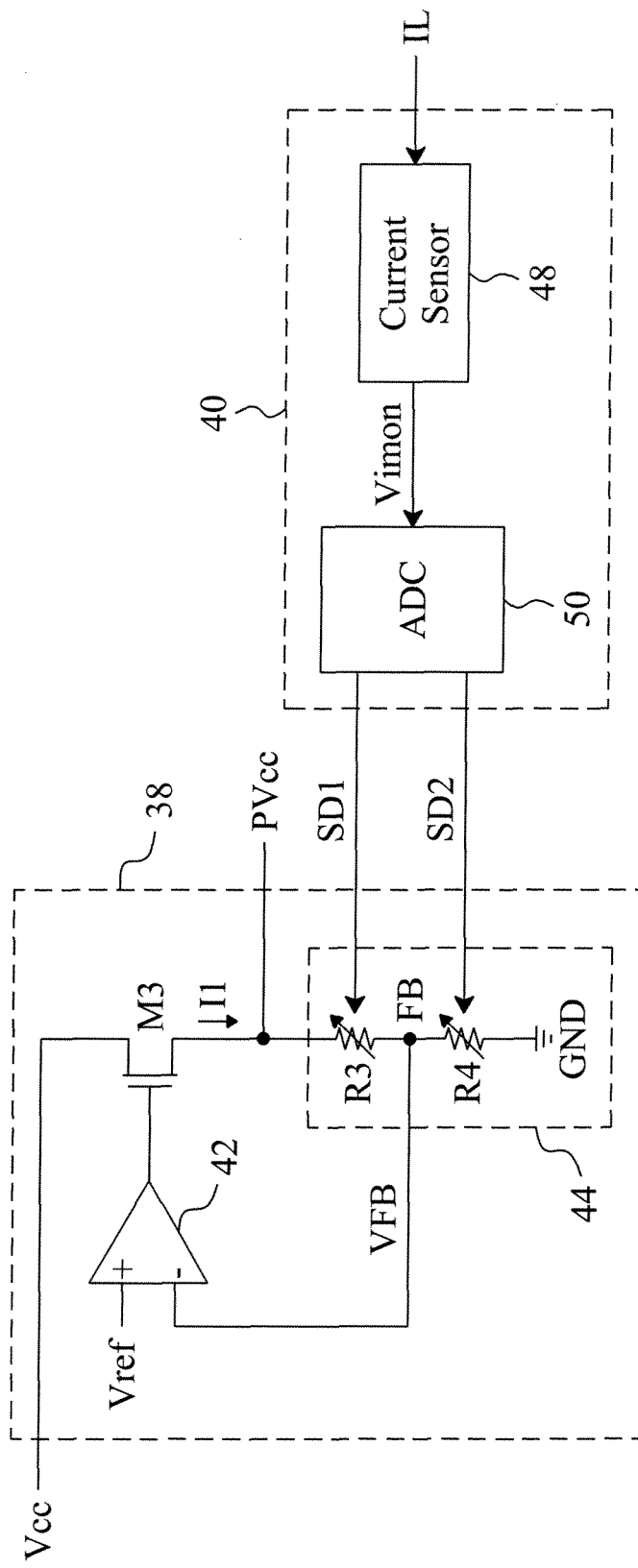
FIG. 6 is a circuit diagram of a second embodiment for the linear regulator and the modulator shown in FIG. 4.

FIG. 6 is a circuit diagram of a second embodiment for the linear regulator 38 and the modulator 40 shown in FIG. 4. The linear regulator 38 has the same circuit as that of FIG. 5, except that the resistors R1 and R2 of the feedback loop 44 are replaced by variable resistors R3 and R4. The modulator 40 has the same current sensor 48 as that of FIG. 5, for sensing the load current IL to generate the current sense signal Vimon, and an analog-to-digital converter (ADC) 50 for converting the current sense signal Vimon to digital signals SD1 and SD2 for controlling the resistances of the variable resistors R3 and R4, respectively, to adjust the feedback ratio. When the switching power supply transits from heavy loading to light loading, the ADC 50 decreases the resistance of the variable resistor R3 or increases the resistance of the variable resistor R4, so that the driver voltage PVcc becomes lower.

Figure 7:
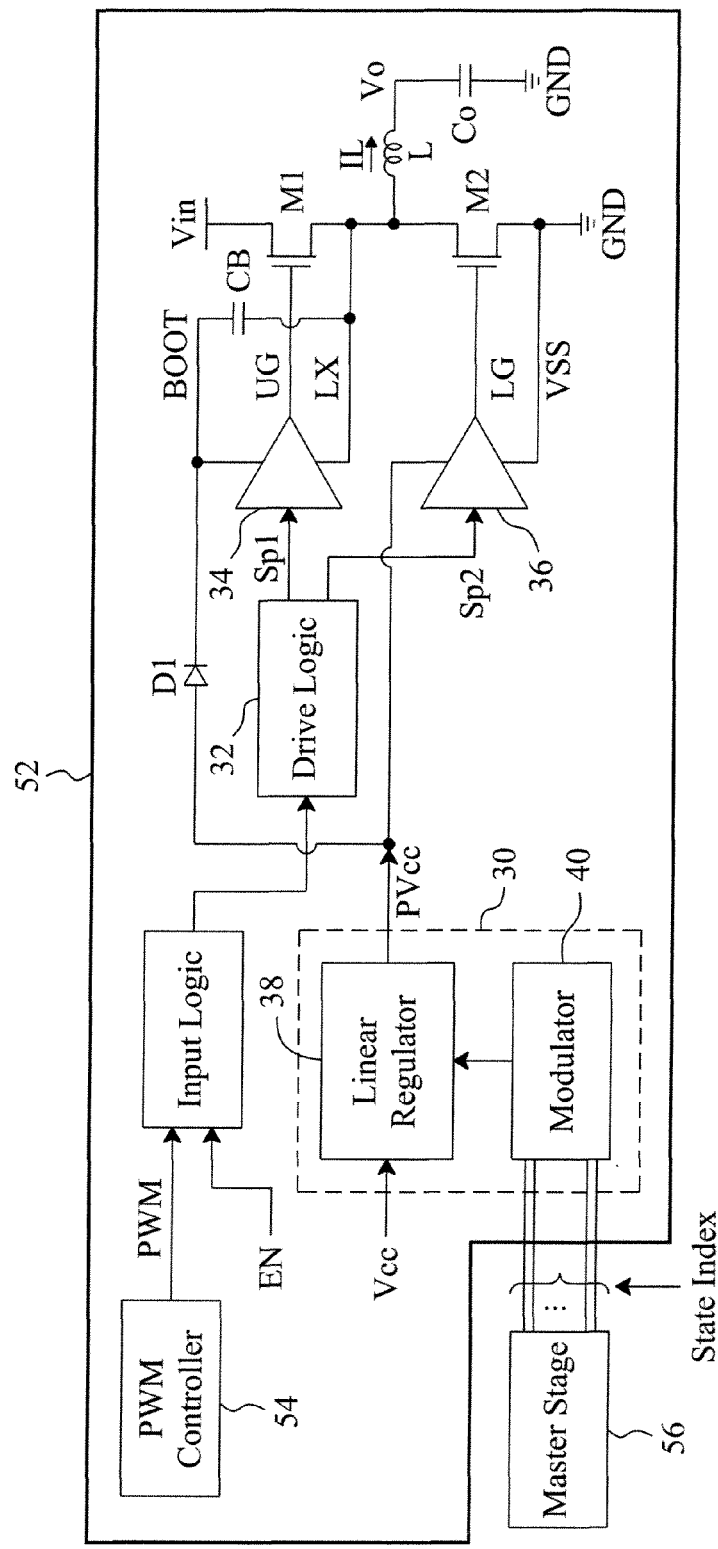
FIG. 7 is a block diagram of a second embodiment according to the present invention.

FIG. 7 is a block diagram of a second embodiment according to the present invention, in which a switching power supply 52 is implemented by a single chip. A PWM controller 54 provides a pulse width modulation signal PWM, a drive logic 32 generates signals Sp1 and Sp2 according to the pulse width modulation signal PWM, drivers 34 and 36 generate control signals UG and LG according to the signals Sp1 and Sp2 for switching power switches M1 and M2 serially connected between a voltage input terminal Vin and a ground terminal GND to convert an input voltage Vin to an output voltage Vo, and an adjustable driver voltage source 30 adjusts the driver voltage PVcc supplied to the drivers 34 and 36 according to a state index provided by a master stage 56, for example a CPU, to adjust the voltage levels of the control signals UG and LG. In this embodiment, the state index is a digital signal including the information of the loading state of the switching power supply 52. The adjustable driver voltage source 30 includes a linear regulator 38 for converting a supplied voltage Vcc to the driver voltage PVcc, and a modulator 40 for controlling the linear regulator 38 according to the state index so as to adjust the driver voltage PVcc.

Figure 8:
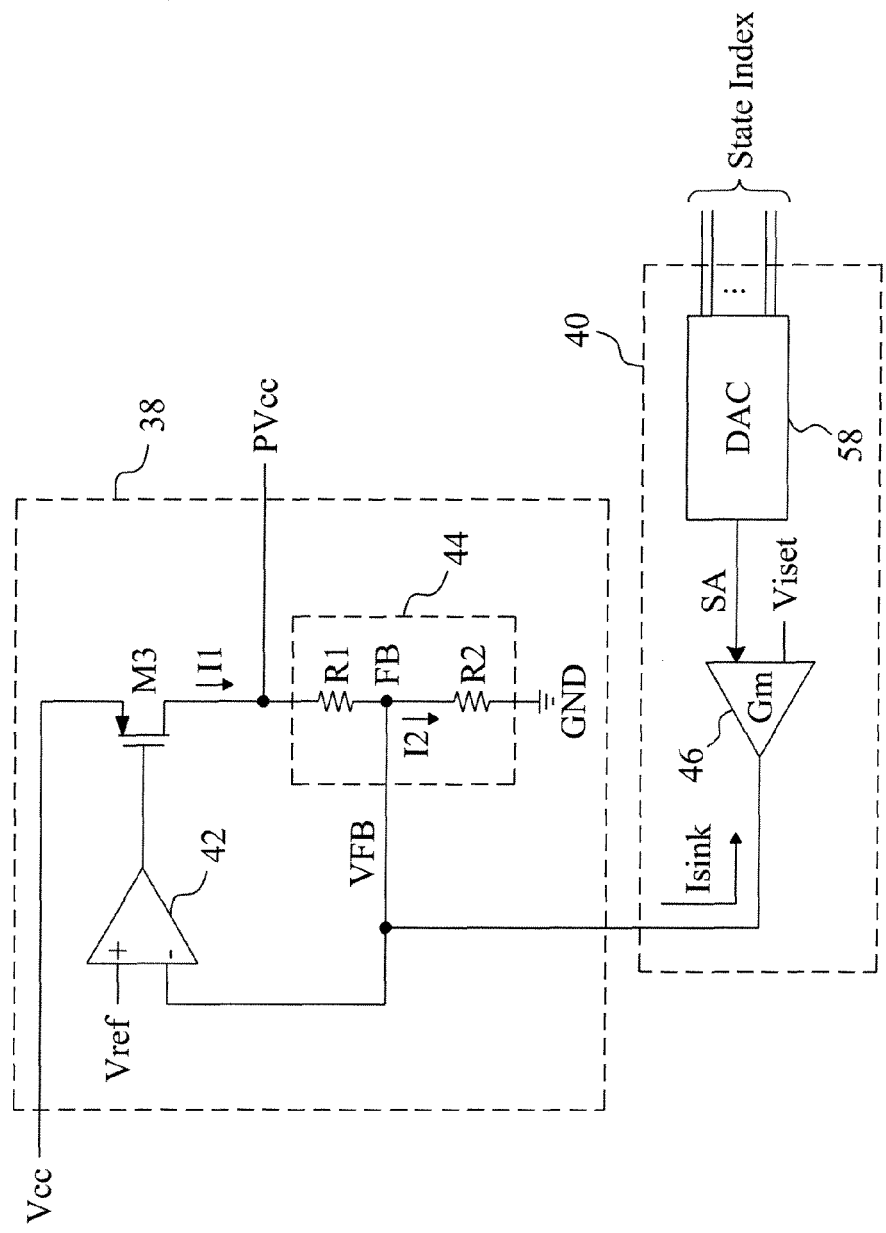
FIG. 8 is a circuit diagram of a first embodiment for the linear regulator and the modulator shown in FIG. 7.

FIG. 8 is a circuit diagram of a first embodiment for the linear regulator 38 and the modulator 40 shown in FIG. 7. The linear regulator 38 has the same circuit as that of FIG. 5, while the modulator 40 includes a digital-to-analog converter (DAC) 58 for converting the state index to an analog signal SA, and a transconductance amplifier 46 for sinking a current Isink from the feedback terminal FB according to a difference value between the analog signal SA and a setting value Viset so as to change the feedback signal VFB. When the switching power supply is at light loading, the analog signal SA is lower than the setting value Viset, and thus the transconductance amplifier 46 does not sink any current Isink from the feedback terminal FB, thereby regulating the driver voltage PVcc at a lower level. When the switching power supply turns to heavy loading, the analog signal SA becomes higher than the setting value Viset and causes the transconductance amplifier 46 to sink a current Isink from the feedback terminal FB, thereby lowering the feedback signal VFB. As a result, the operational amplifier 42 increases the current I1 of the transistor M3, and the driver voltage PVcc is thus increased to a higher level.

Figure 9:
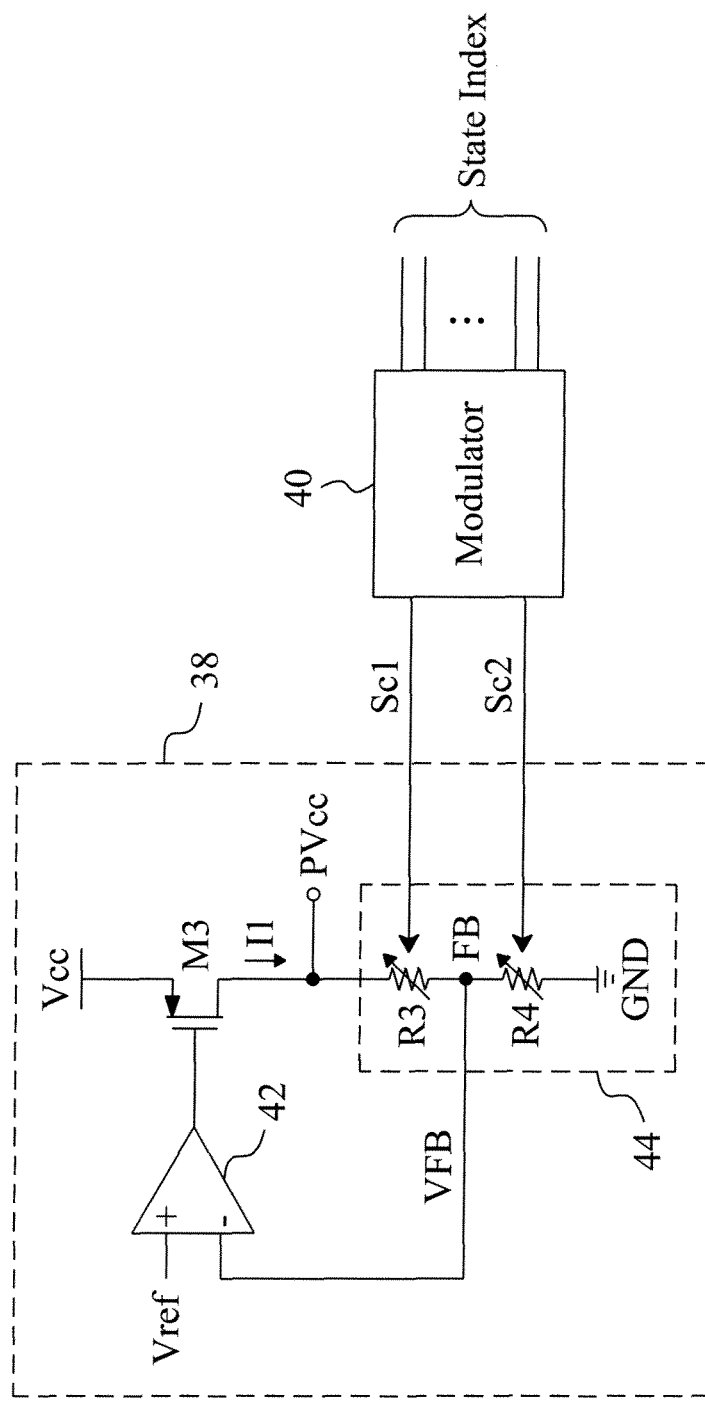
FIG. 9 is a circuit diagram of a second embodiment for the linear regulator shown in FIG. 7.

FIG. 9 is a circuit diagram of a second embodiment for the linear regulator 38 shown in FIG. 7. The linear regulator 38 has the same circuit as that of FIG. 6, while the modulator 40 generates control signals Sc1 and Sc2 according to the state index to control the resistances of the variable resistors R3 and R4, respectively, so as to adjust the feedback ratio. When the switching power supply transits from heavy loading to light loading, the modulator 40 may decrease the resistance of the variable resistor R3 or increase the resistance of the variable resistor R4, so that the driver voltage PVcc becomes lower.

Figure 1:
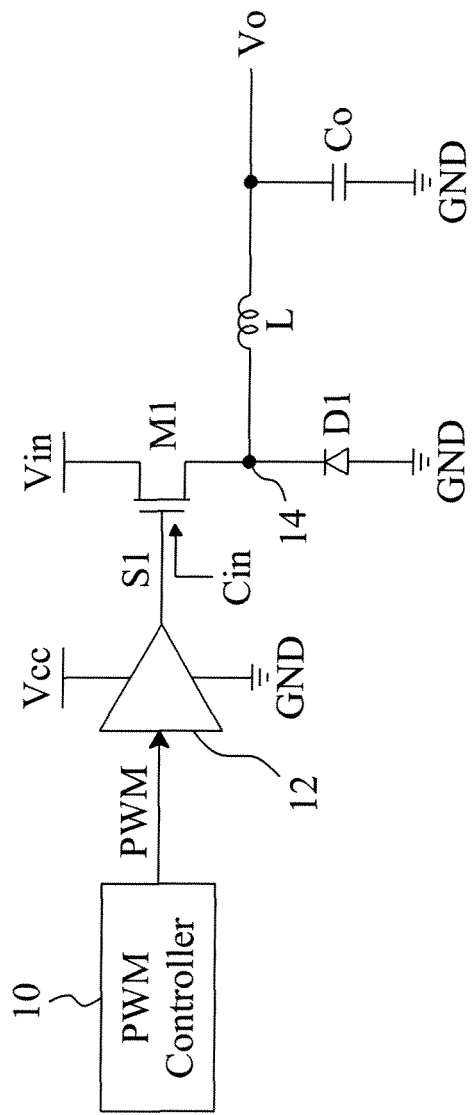
FIG. 1 is a circuit diagram of a typical asynchronous switching power supply.
Figure 2:
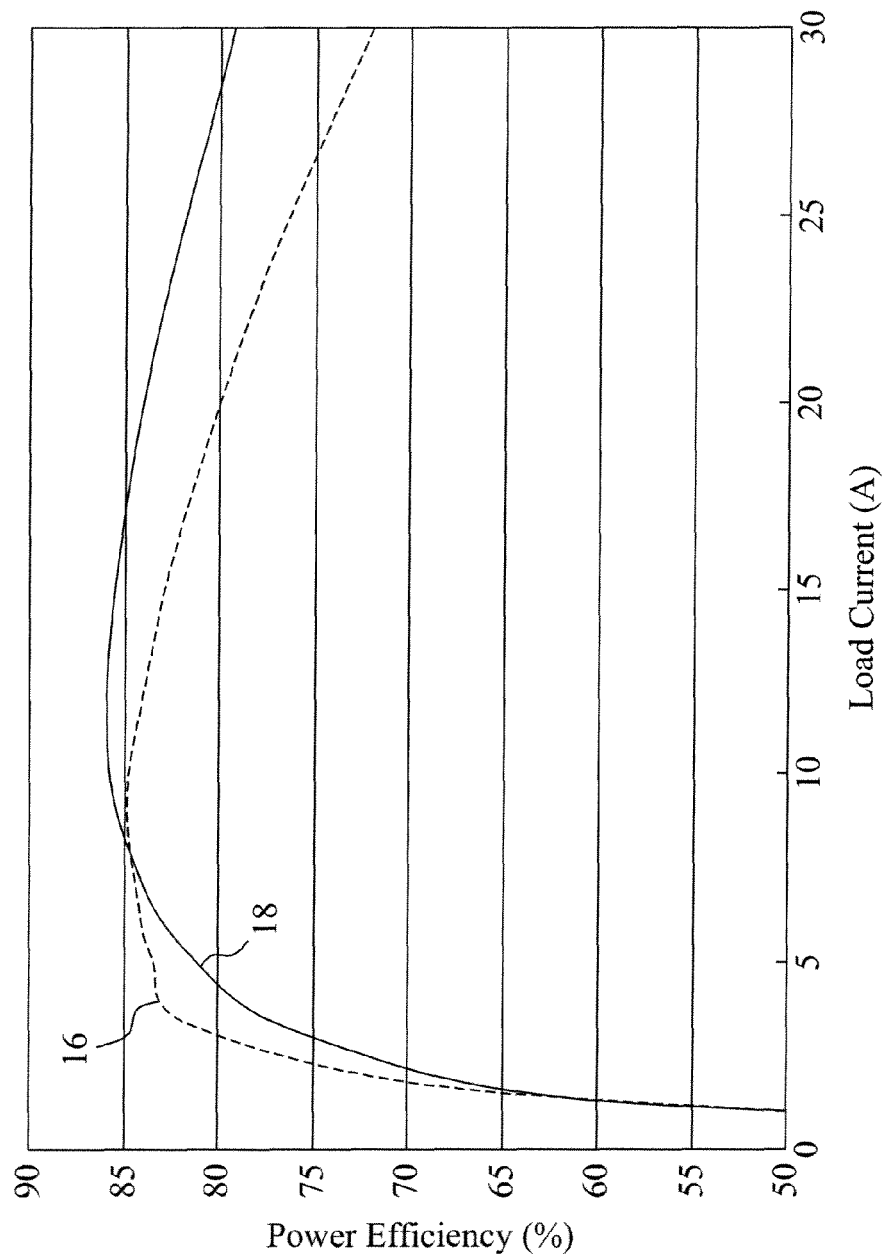
FIG. 2 is a diagram showing the power efficiency to loading of the circuit of FIG. 1 under different driver voltages.
Figure 3:
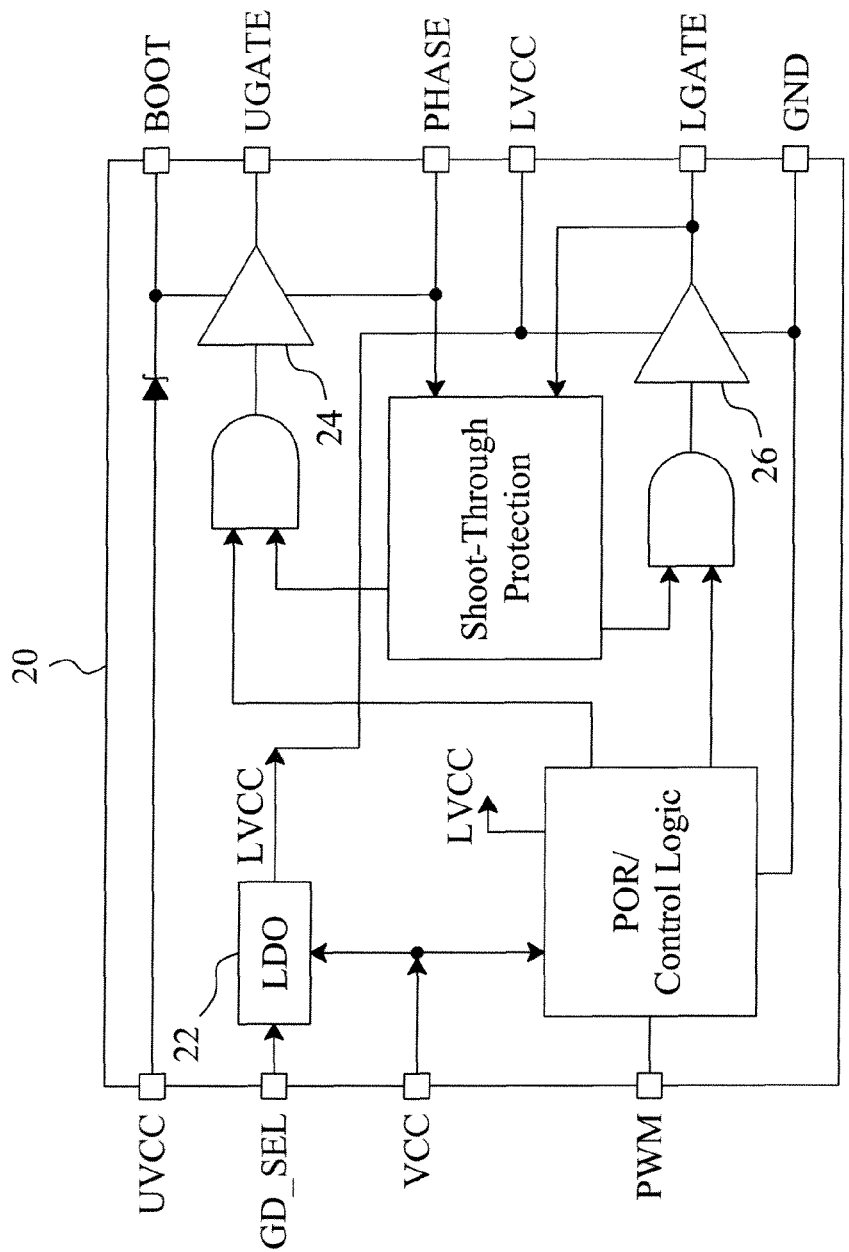
FIG. 3 is a block diagram of an Intersil's driver chip.

As compared with the prior art shown in FIG. 3, an adjustable driver voltage source according to the present invention only requires one driver voltage PVcc and thereby simpler circuit to implement. As compared with the prior art of U.S. Pat. No. 7,345,463, the present invention is not only applicable to a single-chip switching power supply, but also applicable to a multi-chip switching power supply, and has much simpler circuit architecture.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:
1. An adjustable driver voltage source for a switching power supply including a power switch and a driver for providing a control signal to switch the power switch, the adjustable voltage source comprising:
    a linear regulator providing a driver voltage to the driver that determines a voltage level of the control signal, the linear regulator comprising:

a transistor connected to a voltage output terminal of the linear regulator;

an operational amplifier connected to the transistor, controlling a current of the transistor according to a feedback signal to determine the driver voltage; and a feedback loop connected to the operational amplifier and the voltage output terminal of the linear regulator, generating the feedback signal according to the driver voltage; and a modulator connected to the linear regulator, responsive to a loading change of the switching power supply to change the feedback signal to adjust the driver voltage;

wherein the feedback loop comprises:

a resistor serially connected to the transistor; and a feedback terminal between the resistor and the transistor, for providing the feedback signal;

wherein the modulator comprises:

a current sensor sensing a load current of the switching power supply to generate a current sense signal; and a transconductance amplifier connected to the current sensor and the linear regulator, for sinking a current from the feedback terminal according to a difference value between the current sense signal and a setting value so as to adjust the driver voltage.

2. An adjustable driver voltage source for a switching power supply including a power switch and a driver for providing a control signal to switch the power switch, the adjustable voltage source comprising:

a linear regulator providing a driver voltage to the driver that determines a voltage level of the control signal, the linear regulator comprising:

a transistor connected to a voltage output terminal of the linear regulator;

an operational amplifier connected to the transistor, controlling a current of the transistor according to a feedback signal to determine the driver voltage; and a feedback loop connected to the operational amplifier and the voltage output terminal of the linear regulator, generating the feedback signal according to the driver voltage; and a modulator connected to the linear regulator, responsive to a loading change of the switching power supply to change the feedback signal to adjust the driver voltage;

wherein the feedback loop comprises:

a resistor serially connected to the transistor; and a feedback terminal between the resistor and the transistor, for providing the feedback signal;

wherein the modulator comprises:

a digital-to-analog converter converting a digital signal related to a loading state of the switching power supply to an analog signal; and a transconductance amplifier connected to the digital-to-analog converter and the linear regulator, for sinking a current from the feedback terminal according to a difference value between the analog signal and a setting value so as to adjust the driver voltage.

3. A method for adjusting driver voltage in a switching power supply including a power switch and a driver for providing a control signal to switch the power switch, the method comprising the steps of:

A.) using a linear regulator to provide the driver voltage to the driver that determines a voltage level of the control signal;

B.) detecting the driver voltage to generate a feedback signal at a feedback terminal to regulate the driver voltage; and C.) changing the feedback signal in response to a loading change of the switching power supply to adjust the driver voltage;

wherein the step C comprises the steps of:

sensing a load current of the switching power supply to generate a current sense signal; and sinking a current from the feedback terminal according to a difference value between the current sense signal and a setting value so as to adjust the driver voltage.

4. The method of claim 3, wherein the step B comprises the step of dividing the driver voltage by a pair of serially connected resistors to generate the feedback signal.

5. A method, for adjusting driver voltage in a switching power supply including a power switch and a driver for providing a control signal to switch the power switch, the method comprising the steps of:

A.) using a linear regulator to provide the driver voltage to the driver that determines a voltage level of the control signal;

B.) detecting the driver voltage to generate a feedback signal at a feedback terminal to regulate the driver voltage; and C.) changing the feedback signal in response to a loading change of the switching power supply to adjust the driver voltage;

wherein the step C comprises the steps of:

converting a digital signal related to a loading state of the switching power supply to an analog signal; and sinking a current from the feedback terminal according to a difference value between the analog signal and a setting value so as to adjust the driver voltage.

6. The method of claim 5, wherein the step B comprises the step of dividing the driver voltage by a pair of serially connected resistors to generate the feedback signal.

* * * * *